United States Patent
Mak et al.

(10) Patent No.: US 6,721,216 B2
(45) Date of Patent: Apr. 13, 2004

(54) MEMORY ADDRESSING STRUCTURAL TEST

(75) Inventors: Tak M. Mak, Union City, CA (US); Michael R. Spica, Hillsboro, OR (US); Michael J. Tripp, Forest Grove, OR (US)

(73) Assignee: Intel Corporation, Santa Clara, CA (US)

( * ) Notice: Subject to any disclaimer, the term of this patent is extended or adjusted under 35 U.S.C. 154(b) by 200 days.

(21) Appl. No.: 09/823,597

(22) Filed: Mar. 30, 2001

(65) Prior Publication Data

US 2002/0141276 A1 Oct. 3, 2002

(51) Int. Cl.[7] .............................................. G11C 29/00
(52) U.S. Cl. ............. 365/201; 365/230.06; 365/189.05; 365/233; 714/718
(58) Field of Search .................................. 365/200, 201, 365/233, 189.05, 230.06; 714/718

(56) References Cited

U.S. PATENT DOCUMENTS

| 4,503,536 A | | 3/1985 | Panzer ..................... 714/732 |
| 4,527,272 A | | 7/1985 | Reiney ..................... 714/736 |
| 4,903,266 A | * | 2/1990 | Hack ......................... 708/252 |
| 5,184,327 A | * | 2/1993 | Matsuda et al. ............ 365/201 |

* cited by examiner

Primary Examiner—Andrew Q. Tran
(74) Attorney, Agent, or Firm—Blakely, Sokoloff, Taylor & Zafman LLP

(57) ABSTRACT

An apparatus and method for testing an address decoder and word lines of a memory array comprised of connecting a signature analyzer to the word lines emanating from an address decoder, setting a clock used to trigger the latching of the states of the word lines by the signature analyzer, transmitting an address to the address decoder to be decoded, and triggering the signature analyzer to latch the state of the word lines.

19 Claims, 2 Drawing Sheets

MEMORY ADDRESSING STRUCTURAL TEST

FIELD OF THE INVENTION

The present invention is related to the use of structural testing techniques to speed the testing of a memory array beyond what is possible with conventional functional tests.

ART BACKGROUND

As memory arrays commonly used in many electronic devices become increasingly larger and more densely packed, the testing complexity increases exponentially, and so does the time required to thoroughly test the individual cells and other memory array components. As a result, manufacturing test processes take increasing longer to complete, as do efforts to debug the faults that are found.

Common practice within the art is to make use of functional tests wherein various combinations of values are written to and read back from memory cells within a memory array. However, as both the rows and columns of memory cells within memory arrays continue to increase in size, the number of write and read operations required to adequately test the memory cells increases exponentially, and causes a corresponding exponential increase in the amount of time required to carry out such tests. This has prompted questions about engaging in making increasing tradeoffs between manufacturing throughput of parts and thoroughness of test coverage, increasing the likelihood that faulty memory arrays will be passed on to customers.

Such functional tests also do not provide much in the way of information needed to trace the source of the failure. In essence, when it is found that a cell has returned a value other than what was last written to it, this result doesn't not provide an indication as to whether it was an address decoder fault, a data latch fault, a data line fault, a memory cell fault or a driver fault. Therefore, further tests are needed to isolate the fault within the memory array so that subsequent manufacturing yields may be improved, and as memory arrays continue to increase in size, the length of time required to perform these additional tests also increases.

BRIEF DESCRIPTION OF THE DRAWINGS

The objects, features, and advantages of the present invention will be apparent to one skilled in the art in view of the following detailed description in which.

DETAILED DESCRIPTION

In the following description, for purposes of explanation, numerous details are set forth in order to provide a thorough understanding of the present invention. However, it will be apparent to one skilled in the art that these specific details are not required in order to practice the present invention.

The present invention concerns testing address decoders and word lines in memory arrays in which there exists an array of memory cells organized in rows and columns, wherein the memory cells are dynamically and randomly accessible, as in the case of commonly available DRAM and SRAM ICs. However, as those skilled in the art will appreciate, the present invention is also applicable to arrays of other circuits, including but not limited to, ROM ICs, erasable ROM ICs, programmable logic devices and components organized into arrays within microprocessors.

Figure 1:
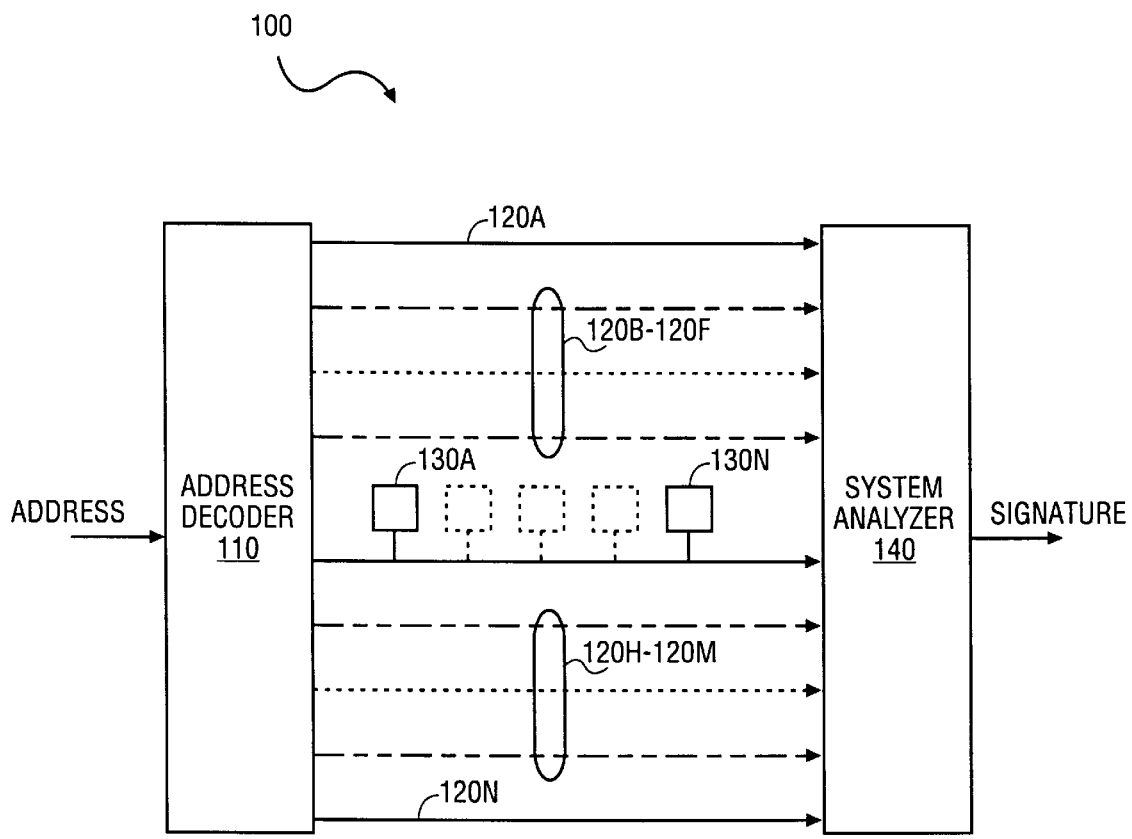
FIG. 1 is a block diagram of one embodiment of the present invention.

FIG. 1 is a block diagram of one embodiment of the present invention. is A portion of memory array 100 is depicted, comprised of address decoder 110, word lines 120a through 120n, memory cells 130a through 130n, and signature analyzer 140.

Address decoder 110 performs part of the address decoding that is usually carried out during normal read, write and other operations performed by memory array 100 during normal use. Word lines 120a through 120n are the outputs of address decoder 110. Address decoder 110 decodes a portion of the address received by memory array 100 and turns on one (and only one) of word lines 120a through 120n in response. Memory cells 130a through 130n are connected to word line 120g, but are typical of the memory cells of the type connected to each of word lines 120a through 120n. In normal operation, only memory cells connected to the word line that is turned on by address decoder 110 should become accessible for read, write or other operations. Depending on the design of the topography of memory array 100, either a single memory cell or a plurality of memory cells connected to the one word line that has been turned on may be accessed during a read, write or other operation.

Signature analyzer 140 is connected to word lines 120a through 120n emanating from address decoder 110. Signature analyzer 140 is used to monitor signals on word lines 120a through 120n, which originate from address decoder 110, to detect malfunctions that might cause memory cells attached to various ones of the word lines to become accessible at times when they should not be, or to fail to become accessible for read, write or other operations. In one embodiment, the output of signature analyzer 140 is a cumulative result of the activity occurring on word lines 120a through 120n through the decoding of a plurality of addresses by address decoder 110, revealing if there were any instances in which a word line failed to turn on, or where an incorrect word line was turned on, or where more than one word line was turned on. In an alternate embodiment, signature analyzer 140 provides an output for each address decoded by address decoder 110.

In one embodiment, signature analyzer 140 is comprised of latches and exclusive-or gates coupled to create a single signature indicative of the activity observed on word lines 120a through 120n through the decoding of a plurality of addresses by address decoder 110, with the activity observed on word lines 120a through 120n being latched by signature analyzer 140 in response to a clock. In one embodiment, the clock is provided by a programmable circuit (not shown), or in an alternate embodiment, the latches within signature analyzer 140 are self-timed. Regardless of the mechanism used to control the timing, the timing may be set such that the latching of word lines 120a through 120n by signature analyzer 140 takes place at a time when it is expected that the output from address decoder 110 on each of word lines 120a through 120n will have stabilized, either to determine the timing margin available, or to confirm that operation at a desired operating speed is possible. Alternatively, the timing could be chosen to provide some margin to ensure that memory cells that are expected to respond during a test have time to do so. Or, in still another alternative the clock may be used to trigger the latching of word lines 120a through 120n by signature analyzer 140 at multiple times during the decoding of an address in order to observe which ones of word lines 120a through 120n respond more slowly.

In one embodiment, signature analyzer 140 and address decoder 110 are connected to opposite ends of word lines 120a through 120n, with signature analyzer 140 taking the place of dummy cells that would otherwise normally be there. By being attached to the opposite ends of word lines 120a through 120n, signature analyzer 140 will be receiving only signals that have fully propagated all along each of the word lines from address decoder 110. This will aid in ensuring an accurate assessment of whether or not signals from address decoder 110 are reaching the memory cells connected along the word lines quickly enough.

In one embodiment, signature analyzer 140 occupies areas of a die on which the circuitry of memory array 100 has been disposed where dummy memory cells are often located to form a border between the edge of memory array 100 and memory cells 130a through 130n which will actually be used in normal operation. By taking the place of dummy memory cells or other dummy components, the amount of die real estate occupied by signature analyzer 140 is minimized, thereby minimizing the costs of adding signature analyzer 140 to memory array 100.

In one embodiment, there is a one-to-one correspondence in the number of address decoders and signature analyzers, such that for each address decoder providing a plurality of word lines, there is a corresponding signature analyzer coupled to that plurality of word lines. However, in alternate embodiments where a memory is divided into a plurality of subarrays which permits multiple ones of the plurality of word lines from the same address decoder to be active, simultaneously, there may be more than one signature analyzer, with each signature analyzer being coupled to a subset of the plurality of word lines from the same address decoder.

Since address decoder 110 is supposed to turn on only one of word lines 120a through 120n at a time, in one embodiment, signature analyzer 140 is comprised of latches and XOR gates. In an alternate embodiment, signature analyzer 140 is a component of a larger scan circuit enabling the testing of components of memory array 100 beyond address decoder 110 and word lines 120a through 120n.

Figure 2:
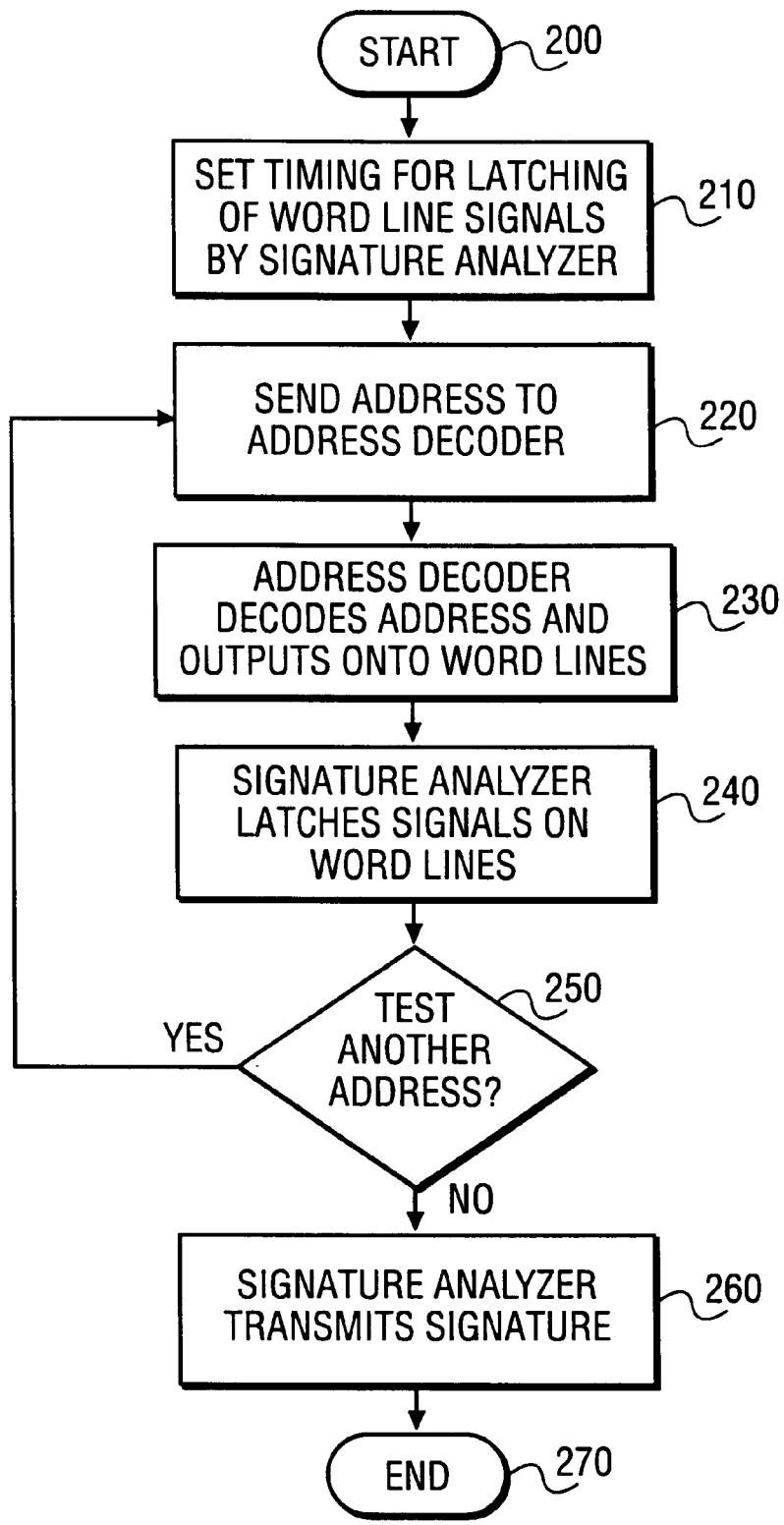
FIG. 2 is a flow chart of another embodiment of the present invention.

FIG. 2 is a flow chart of another embodiment of the present invention. Starting at 200, the timing for the latching by a signature analyzer of signals on word lines connected to the outputs of an address decoder is set at 210. At 220, an address is input to the address decoder, and at 230, the address decoder decodes the address and outputs the result onto the connected word lines. At 240, the signature analyzer latches the signals on the word lines. If, at 250, there is another address to be tested, then testing repeats, starting at 220. However, if the testing of addresses is complete, then the signature analyzer outputs its signature at 260 and the test ends at 270.

In the depicted embodiment, the signature is cumulative of the results of all the addresses tested, such that a single signature reveals if there were any instances in which a word line failed to turn on by the time the signals on the word lines were latched, or if an incorrect word line was turned on, or if more than one word line was turned on. In an alternate embodiment, separate signatures, or separate latched copies of the actual states of the word lines would be transmitted for each address tested.

In one embodiment, if the correct word line was not turned on, or another word line was improperly turned on at the time the signals on the word lines were latched, then a new timing could be set at 210, and testing could be repeated. The timing could be set to allow more or less time for signals to propagate from the address decoder and through the word lines in an effort to determine the amount of timing margin available for normal operation of the memory array to which the address decoder, word lines and signature analyzer belong.

The invention has been described in conjunction with the preferred embodiment. It is evident that numerous alternatives, modifications, variations and uses will be apparent to those skilled in the art in light of the foregoing description. It will be understood by those skilled in the art, that the present invention may be practiced in support of other functions in an electronic device.

The example embodiments of the present invention are described in the context of an array of memory cells controlled, in part, by an address decoder and accompanying word lines. However, the present invention is applicable to a variety of package types and to a variety of electronic, microelectronic and micromechanical devices.

What is claimed is:

1. An apparatus, comprising:
   an address decoder;
   a plurality of word lines emanating from the address decoder;
   at least one memory cell connected to at least one of the word lines; and
   a signature analyzer connected to at least two of the plurality of word lines.

2. The apparatus of claim 1, wherein the address decoder decodes a portion of a memory address.

3. The apparatus of claim 1, wherein the at least one memory cell is a dynamic RAM memory cell.

4. The apparatus of claim 1, wherein the at least one memory cell is a static RAM memory cell.

5. The apparatus of claim 1, wherein the address decoder and the signature analyzer are connected to opposite ends of at least one of the plurality of word lines.

6. The apparatus of claim 1, wherein the signature analyzer latches the state of at least one of the plurality of word lines in response to a clock.

7. The apparatus of claim 6, wherein the timing of the clock is adjustable.

8. A method, comprising:
   setting the timing of a clock used to trigger the latching of inputs to a signature analyzer;
   transmitting an address to an address decoder connected to the inputs of the signature analyzer through a plurality of word lines;
   decoding the address using the address decoder; and
   triggering the signature analyzer with the clock to latch the state of the plurality of word lines connected to the inputs of the signature analyzer.

9. The method of claim 8, further comprising examining the output of the signature analyzer for each address decoded to determine if the correct word line was turned on, and to determine if any other word line was turned on for that address.

10. The method of claim 8, further comprising examining the output of the signature analyzer for a plurality of addresses decoded to determine if the correct word line was turned on, and to determine if any other word line was turned on for all of the plurality of addresses.

11. The method of claim 8, further comprising setting the timing of the clock to a plurality of different settings to determine which ones of the plurality of word lines operate more slowly.

12. The method of claim 8, further comprising setting the timing of the clock so that the plurality of word lines are tested at a desired operating speed.

13. An apparatus, comprising:

an address decoder;

a signature analyzer;

a plurality of circuits organized into a two-dimensional array comprising a first circuit, a second circuit, a third circuit and a fourth circuit;

a first word line coupled to the address decoder, the signature analyzer, the first circuit and the second circuit; and a second word line coupled to the address decoder, the signature analyzer, the third circuit and the fourth circuit.

14. The apparatus of claim 13, wherein the address decoder decodes at least a portion of a memory address.

15. The apparatus of claim 13, wherein the first, second, third and fourth circuits are memory cells.

16. The apparatus of claim 13, wherein the first, second, third and fourth circuits are programmable logic devices.

17. The apparatus of claim 13, wherein the address decoder and the signature analyzer are connected to opposite ends of the first and second word lines.

18. The apparatus of claim 13, wherein the signature analyzer latches the state of at least one of the plurality of word lines in response to a clock.

19. The apparatus of claim 18, wherein the timing of the clock is adjustable.

* * * * *

UNITED STATES PATENT AND TRADEMARK OFFICE
CERTIFICATE OF CORRECTION

PATENT NO. : 6,721,216 B2
DATED : April 13, 2004
INVENTOR(S) : Mak et al.

It is certified that error appears in the above-identified patent and that said Letters Patent is hereby corrected as shown below:

Column 2,
Line 6, immediately after "invention." delete "is".

Signed and Sealed this

Twenty-ninth Day of June, 2004

JON W. DUDAS
*Acting Director of the United States Patent and Trademark Office*